(12) United States Patent
Liao et al.

(10) Patent No.: US 10,734,279 B2
(45) Date of Patent: Aug. 4, 2020

(54) SEMICONDUCTOR PACKAGE DEVICE WITH INTEGRATED ANTENNA AND MANUFACTURING METHOD THEREOF

(71) Applicant: TAIWAN SEMICONDUCTOR MANUFACTURING COMPANY LTD., Hsinchu (TW)

(72) Inventors: Wen-Shiang Liao, Miaoli County (TW); Feng Wei Kuo, Hsinchu County (TW); Chih-Hang Tung, Hsinchu County (TW); Chen-Hua Yu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/666,097

(22) Filed: Oct. 28, 2019

(65) Prior Publication Data
US 2020/0066582 A1 Feb. 27, 2020

Related U.S. Application Data

(62) Division of application No. 15/590,348, filed on May 9, 2017, now Pat. No. 10,460,987.

(51) Int. Cl.
*H01L 21/768* (2006.01)
*H01Q 1/22* (2006.01)
(Continued)

(52) U.S. Cl.
CPC .... *H01L 21/76837* (2013.01); *H01L 23/5389* (2013.01); *H01Q 1/2283* (2013.01);
(Continued)

(58) Field of Classification Search
CPC ......... H01L 23/49816; H01L 23/49822; H01L 23/4927; H01L 23/5227; H01L 23/528;
(Continued)

(56) References Cited

U.S. PATENT DOCUMENTS 6,147,857 A * 11/2000 Worley ............... H01L 23/5223
257/E23.153
9,330,936 B2 * 5/2016 Hasegawa ......... H01L 21/02381
(Continued)

*Primary Examiner* — Maliheh Malek
(74) *Attorney, Agent, or Firm* — WPAT, P.C., Intellectual Property Attorneys; Anthony King

(57) ABSTRACT

A method of manufacturing a semiconductor package includes: coupling a semiconductor die to a protection layer; forming a first redistribution layer over the semiconductor die, wherein the first redistribution layer includes a first conductive plate and a first dielectric material laterally surrounding the first conductive plate; forming a recess in the first redistribution layer, wherein the recess is over the first conductive plate and defined by the first dielectric material; depositing an insulating film in the recess with a second dielectric material of a dielectric constant greater than a dielectric constant of the first dielectric material; and forming a second redistribution layer including a second conductive plate over the insulating film. The insulating film electrically isolates the first conductive plate from the second conductive plate, and one of the first conductive plate and the second conductive plate is configured to radiate or receive electromagnetic wave.

20 Claims, 16 Drawing Sheets

US 10,734,279 B2
Page 2

(51) Int. Cl.
*H01Q 21/06* (2006.01)
*H01L 23/538* (2006.01)
*H01Q 9/04* (2006.01)
*H01L 23/498* (2006.01)

(52) U.S. Cl.
CPC ......... *H01Q 9/0407* (2013.01); *H01Q 21/065* (2013.01); *H01L 23/49816* (2013.01); *H01L 23/49822* (2013.01); *H01L 2223/6677* (2013.01); *H01L 2224/04105* (2013.01); *H01L 2224/12105* (2013.01); *H01L 2224/18* (2013.01); *H01L 2224/73267* (2013.01)

(58) Field of Classification Search
CPC . H01L 23/5389; H01L 23/66; H01L 21/4853; H01L 24/11; H01L 24/19–20; H01L 24/73; H01L 24/83; H01L 2223/6605; H01L 2223/6616; H01L 2223/6638; H01L 2223/6644; H01L 2223/665–6655; H01L 2223/6677; H01L 2224/0401; H01L 2224/04105; H01L 2224/05647; H01L 2224/11334; H01L 2224/12105; H01L 2224/24137; H01L 2224/2919; H01L 2224/73267; H01L 2924/14; H01L 2924/1421; H01L 2924/1816–18162
See application file for complete search history.

(56) References Cited

U.S. PATENT DOCUMENTS

| | | | | |
|---|---|---|---|---|
| 9,536,745 | B2 * | 1/2017 | Narushima | H01L 21/28556 |
| 9,536,782 | B2 * | 1/2017 | Hotta | H01L 21/28556 |
| 9,640,404 | B2 * | 5/2017 | Suzuki | H01L 21/76883 |
| 9,685,350 | B2 * | 6/2017 | Lin | H01L 24/19 |
| 9,711,465 | B2 * | 7/2017 | Liao | H01L 23/66 |
| 9,735,118 | B2 * | 8/2017 | Wang | H01L 23/66 |
| 9,806,040 | B2 * | 10/2017 | Liu | H01L 23/66 |
| 9,953,936 | B2 * | 4/2018 | Chen | H01L 23/66 |
| 9,991,216 | B2 * | 6/2018 | Liao | H01L 23/66 |
| 10,026,616 | B2 * | 7/2018 | Suzuki | H01L 21/32051 |
| 10,153,239 | B2 * | 12/2018 | Wang | H01L 23/66 |
| 10,461,034 | B2 * | 10/2019 | Wu | H01L 21/565 |
| 2003/0108674 | A1 * | 6/2003 | Chung | C23C 16/34 427/255.394 |
| 2012/0062439 | A1 * | 3/2012 | Liao | H01L 23/481 343/841 |
| 2013/0189854 | A1 * | 7/2013 | Hausmann | H01L 21/0217 438/792 |
| 2013/0323859 | A1 * | 12/2013 | Chen | C23C 16/52 438/7 |
| 2014/0084391 | A1 * | 3/2014 | Lenive | H01L 24/24 257/414 |
| 2014/0120723 | A1 * | 5/2014 | Fu | C23C 16/42 438/680 |
| 2014/0154883 | A1 * | 6/2014 | Humayun | H01L 21/67207 438/675 |
| 2014/0266919 | A1 * | 9/2014 | Chen | H01L 23/66 343/700 MS |
| 2015/0001713 | A1 * | 1/2015 | Goetz | H01L 23/5389 257/738 |
| 2015/0102502 | A1 * | 4/2015 | Chiu | H01L 21/561 257/774 |
| 2015/0132939 | A1 * | 5/2015 | Hasegawa | H01L 21/02381 438/602 |
| 2015/0155267 | A1 * | 6/2015 | Hoegerl | H01L 25/0655 257/698 |
| 2015/0194388 | A1 * | 7/2015 | Pabst | H01L 23/552 257/659 |
| 2015/0279735 | A1 * | 10/2015 | Hotta | H01L 21/28556 438/656 |
| 2015/0294936 | A1 * | 10/2015 | Shen | H01L 23/5223 257/532 |
| 2015/0325475 | A1 * | 11/2015 | Bamnolker | C23C 16/045 438/680 |
| 2016/0005702 | A1 * | 1/2016 | Shih | H01L 24/03 257/737 |
| 2016/0056226 | A1 * | 2/2016 | Song | H01L 23/5227 438/381 |
| 2016/0218072 | A1 * | 7/2016 | Liao | H01L 23/66 |
| 2016/0225632 | A1 * | 8/2016 | Shaikh | H01L 21/033 |
| 2016/0233099 | A1 * | 8/2016 | Narushima | H01L 21/28556 |
| 2016/0233220 | A1 * | 8/2016 | Danek | H01L 21/76876 |
| 2016/0276324 | A1 * | 9/2016 | Lin | H01L 24/20 |
| 2016/0284553 | A1 * | 9/2016 | Suzuki | H01L 21/76883 |
| 2016/0329299 | A1 * | 11/2016 | Lin | H01L 23/5226 |
| 2016/0348234 | A1 * | 12/2016 | Suzuki | C23C 16/045 |
| 2016/0351401 | A1 * | 12/2016 | Ba | H01L 21/28556 |
| 2016/0351402 | A1 * | 12/2016 | Suzuki | H01L 21/28556 |
| 2016/0351444 | A1 * | 12/2016 | Schloss | H01L 21/76876 |
| 2016/0379879 | A1 * | 12/2016 | Hotta | H01L 21/28556 438/656 |
| 2017/0040266 | A1 * | 2/2017 | Lin | H01L 23/5383 |
| 2017/0117155 | A1 * | 4/2017 | Bamnolker | H01L 21/28556 |
| 2017/0125538 | A1 * | 5/2017 | Sharangpani | H01L 27/1157 |
| 2017/0126047 | A1 * | 5/2017 | Chen | H01L 23/66 |
| 2017/0162524 | A1 * | 6/2017 | Wang | H01L 23/66 |
| 2017/0236776 | A1 * | 8/2017 | Huynh | H01L 23/3677 257/428 |
| 2017/0338195 | A1 * | 11/2017 | Wang | H01L 23/66 |
| 2017/0350008 | A1 * | 12/2017 | Collins | C23C 16/0272 |
| 2018/0025999 | A1 * | 1/2018 | Yu | H01L 23/3114 257/428 |
| 2018/0053660 | A1 * | 2/2018 | Jandl | H01L 21/76877 |
| 2018/0108637 | A1 * | 4/2018 | Yu | H01L 23/3107 |
| 2018/0191053 | A1 * | 7/2018 | Ndip | H01L 24/24 |
| 2018/0226368 | A1 * | 8/2018 | Chen | H01L 23/66 |
| 2018/0237911 | A1 * | 8/2018 | Narushima | C23C 16/0272 |
| 2018/0247905 | A1 * | 8/2018 | Yu | H01L 23/5383 |
| 2018/0342470 | A1 * | 11/2018 | Liao | H01L 23/552 |
| 2018/0342552 | A1 * | 11/2018 | Ho | H01L 27/1462 |
| 2019/0035737 | A1 * | 1/2019 | Wu | H01L 21/6835 |
| 2019/0089038 | A1 * | 3/2019 | Liao | H01Q 9/0407 |
| 2019/0096828 | A1 * | 3/2019 | Wu | H01L 21/565 |
| 2019/0103680 | A1 * | 4/2019 | Liao | H01Q 21/005 |
| 2019/0148262 | A1 * | 5/2019 | Pei | H01L 21/6836 257/713 |
| 2019/0148274 | A1 * | 5/2019 | Yu | H01L 23/481 257/668 |
| 2019/0157206 | A1 * | 5/2019 | Wang | H01L 23/66 |
| 2019/0157240 | A1 * | 5/2019 | Tsai | H01L 24/20 |
| 2019/0172793 | A1 * | 6/2019 | Kim | H01L 23/3142 |
| 2019/0181096 | A1 * | 6/2019 | Wu | H01L 23/5389 |
| 2019/0207304 | A1 * | 7/2019 | Kim | H01Q 9/045 |
| 2019/0221917 | A1 * | 7/2019 | Kim | H01L 23/3121 |
| 2019/0280374 | A1 * | 9/2019 | Kim | H01Q 1/38 |
| 2019/0333871 | A1 * | 10/2019 | Chen | H01L 23/3135 |
| 2019/0333875 | A1 * | 10/2019 | Liao | H01L 23/645 |
| 2019/0371694 | A1 * | 12/2019 | Hsu | H01L 21/76816 |
| 2020/0006191 | A1 * | 1/2020 | Pei | H01L 23/5389 |
| 2020/0013704 | A1 * | 1/2020 | Yu | H01L 24/20 |
| 2020/0035625 | A1 * | 1/2020 | Wang | H01L 23/49827 |
| 2020/0043893 | A1 * | 2/2020 | Chen | H01L 21/486 |
| 2020/0091076 | A1 * | 3/2020 | Kim | H01L 21/568 |

* cited by examiner

SEMICONDUCTOR PACKAGE DEVICE WITH INTEGRATED ANTENNA AND MANUFACTURING METHOD THEREOF

PRIORITY CLAIM AND CROSS-REFERENCE

This application is a division of U.S. patent application Ser. No. 15/590,348 filed May 9, 2017, the entire contents of the above-referenced application being hereby incorporated herein by reference.

BACKGROUND

In modern semiconductor devices and systems, integration and miniaturization of components have progressed at an increasingly rapid pace. In wireless applications, one of the growing challenges encountered by the integration process is the disposition of radio frequency devices or antennas. Conventional antennas associated with integrated circuits are usually designed with limited performance and capability due to the competing objective of size reduction. Thus, an improved integrated antenna structure is desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
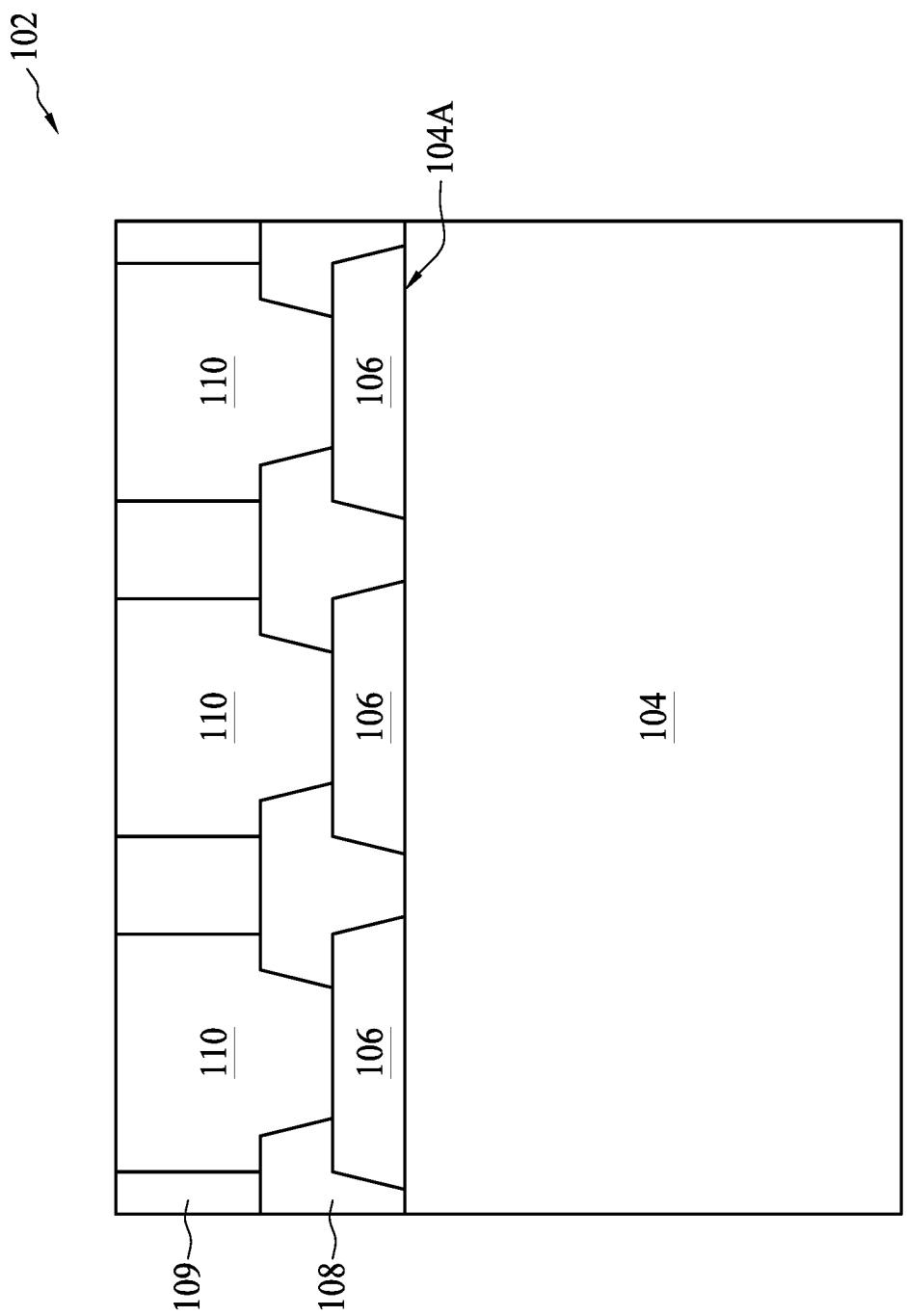
FIGS. 1A through 1K are cross-sectional views of intermediate structures for a method of manufacturing a semiconductor package device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a semiconductor package device integrated with an antenna and its associated manufacturing operations according to various embodiments. In emerging wireless communication applications, such as fifth generation communication (5G), car radar, internet of things (IoT), and wearable devices, a highly-integrated system with an embedded antenna structure is desired in terms of device footprint and manufacturing cost. The return loss and impedance match of the integrated antenna is better managed using modern semiconductor fabrication methods compared with earlier techniques. As a result, the proposed antenna package can provide a better radiation efficiently in a giga-hertz (GHz) range (e.g., between 28 GHz and 77 GHz) with a more compact size.

FIGS. 1A through 1K are cross-sectional views of intermediate structures for a method of manufacturing a semiconductor package device 100, in accordance with some embodiments. Before a composite package device 100 is fabricated, a semiconductor die 102 is formed separately as shown in FIG. 1A. The semiconductor die 102 may be a radio frequency integrated circuit (RFIC), a baseband transceiver die, a microprocessor die, a signal processing die, or combinations thereof.

The semiconductor die 102 comprises a substrate (or called die substrate) 104. The substrate 104 includes a semiconductor material, such as silicon. In one embodiment, the substrate 104 may include other semiconductor materials, such as silicon germanium, silicon carbide, gallium arsenide, or the like. The substrate 104 may be a p-type semiconductive substrate (acceptor type) or an n-type semiconductive substrate (donor type). Alternatively, the substrate 104 includes another elementary semiconductor, such as germanium; a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. In yet another alternative, the substrate 104 is a semiconductor-on-insulator (SOI). In other alternatives, the substrate 104 may include a doped epi layer, a gradient semiconductor layer, or a semiconductor layer overlaying another semiconductor layer of a different type, such as a silicon layer on a silicon germanium layer.

Various components may be formed on a front surface (front side) 104A of the substrate 104. Examples of the components include active devices, such as transistors and diodes, and passive devices, such as capacitors, inductors, and resistors. The components may also include conductive elements, such as conductive traces or vias, and insulating materials. In addition, the semiconductor die 102 comprises one or more connection terminals 106, referred to as conductive pads or bond pads. The components of the substrate 104 are electrically coupled to external circuits or devices through the connection terminals 106.

A dielectric layer 108 or a passivation layer is deposited on the connection terminals 106. The dielectric layer 108 may be provided by initially forming a blanket dielectric material through a suitable process, such as chemical vapor deposition (CVD), physical vapor deposition (PVD), atomic layer deposition (ALD), or the like. Later, a photoresist (not separately shown) is formed over the blanket material. Patterning operations, such as lithographic and etching methods, are performed on the photoresist layer to expose the connection terminal 106, thereby exposing the respective connecting terminals 106. Excessive portions of the dielectric material are removed, resulting in the shaping of the dielectric layer 108 as desired. The dielectric layer 108 may be formed with a variety of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), a polymer material, or the like.

Moreover, a conductive layer is deposited on the connection terminal 106 and then patterned to form conductors 110 over the respective connection terminals 106. Materials of the conductors 110 include, for example, titanium (Ti), tantalum (Ta), titanium nitride (TiN), tantalum nitride (TaN), copper (Cu), copper alloys, nickel (Ni), tin (Sn), gold (Au), and combinations thereof. In some embodiments, the conductors 110 comprise a layered structure comprising different conductive sublayers.

A dielectric material 109 is formed to surround the conductors 110. In some embodiments, the dielectric material 109 may be aligned with edges of the semiconductor die 102. In some embodiments, the dielectric material may be comprised of silicon oxide, silicon nitride, silicon oxynitride, or the like. In some embodiments, the dielectric material 109 includes a polymeric material such as polyimide (PI), polybenzoxazole (PBO), benzocyclobuten (BCB), epoxy, or the like. The dielectric material 109 may be formed using a CVD, PVD, or other suitable operation. In some embodiments, a planarization operation, such as grinding or chemical mechanical polishing (CMP), may be performed to remove excess portions of the dielectric material 109 and level the dielectric material 109 with the conductors 110.

Figure 1B:
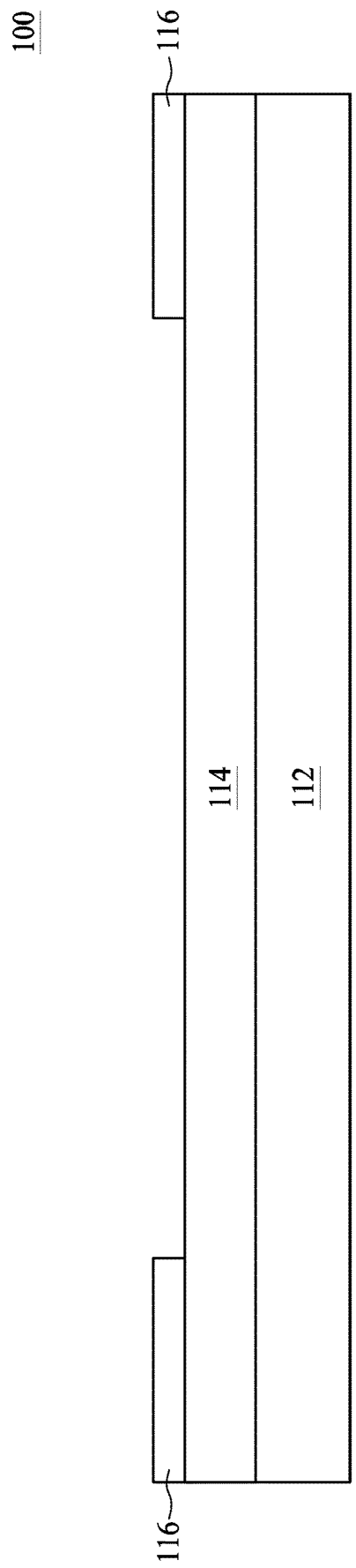

FIGS. 1B through 1K are cross-sectional views of intermediate structures for a method of manufacturing the semiconductor package device 100, in accordance with various embodiments. Initially, a carrier 112 is provided as shown in FIG. 1B. The carrier 112 may comprise, for example, silicon based materials, such as glass, silicon oxide, aluminum oxide, ceramic materials, or combinations thereof. In some embodiments, the carrier 112 is made of any strippable or easily removed material, for example, films, tapes, or the like. Next, a protection layer 114 is formed over the carrier 112. The protection layer 114 may be formed of dielectric materials such as silicon oxide, silicon nitride, silicon oxynitride, or the like. In some embodiments, the protection layer 114 includes a polymeric material such as PI, PBO, BCB, epoxy, or the like.

A redistribution layer (RDL) 116 formed over the protection layer 114. The RDL 116 is configured to electrically connect components of the semiconductor package device 100, such as the semiconductor die 102, with other layers. The RDL 116 may include multiple metal layers. Each of the metal layers may include conductive wires or lines and is electrically coupled to an adjacent overlaying or underlying metal layer through metal vias. In some embodiments, the metal layer of the RDL 116 is formed of conductive materials, such as copper, silver, aluminum, gold or tungsten. In some embodiments, the remaining portion of the redistribution layer 116 may be filled with dielectric materials (not separately shown). The dielectric material may be formed of oxides, such as un-doped silicate glass (USG), fluorinated silicate glass (FSG), borophosphosilicate glass (BPSG), tetraethosiloxane (TEOS), spin-on glass (SOG), high-density plasma (HDP) oxide, plasma-enhanced TEOS (PE-TEOS), or the like. In some embodiments, several conductive pads (not separately shown) are disposed over the metal layer of the RDL 116. The metal layer of the redistribution layer 116 may be connected to the conductive pads through an exposed top surface.

Figure 1C:
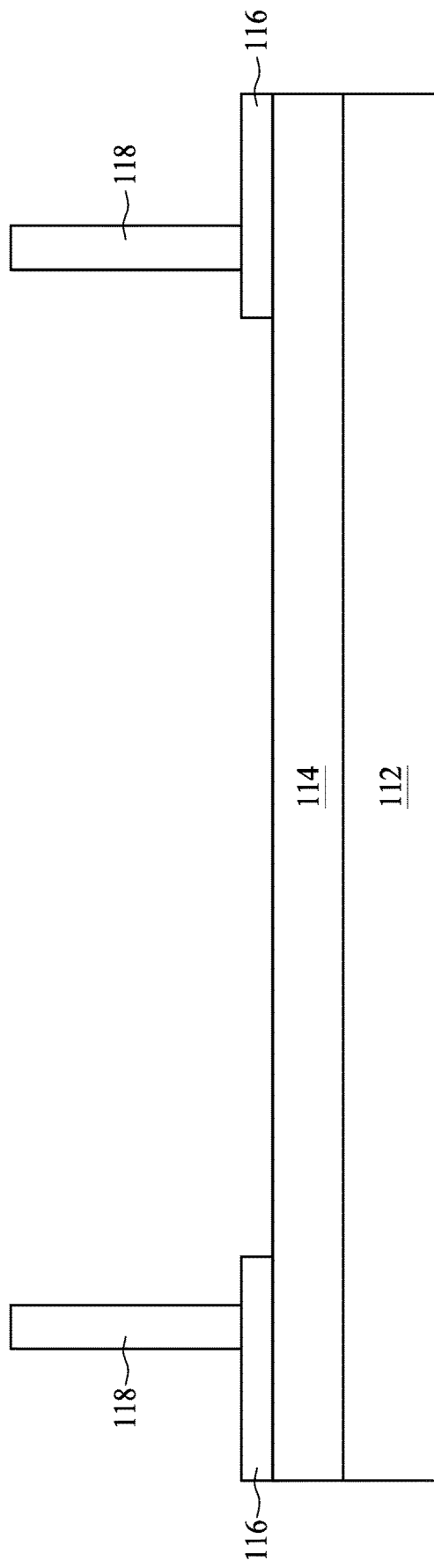

Next, one or more conductive pillars 118 are formed over the RDL 116, as illustrated in FIG. 1C. In an exemplary operation, a photoresist layer (not separately shown) may be formed over the protection layer 114 and the RDL 116. The photoresist layer is patterned using photolithography techniques. Generally, photolithographic techniques involve masking, exposure, and development of the photoresist layer. After the photoresist layer is patterned, an etching operation may be performed to remove unwanted portions of the photoresist layer, thus leaving patterned recesses. A conductive material is then filled in the recesses to form the conductive pillar 118. The photoresist layer may be removed by, for example, an ashing operation after the conductive pillar 118 is completed.

Figure 1D:
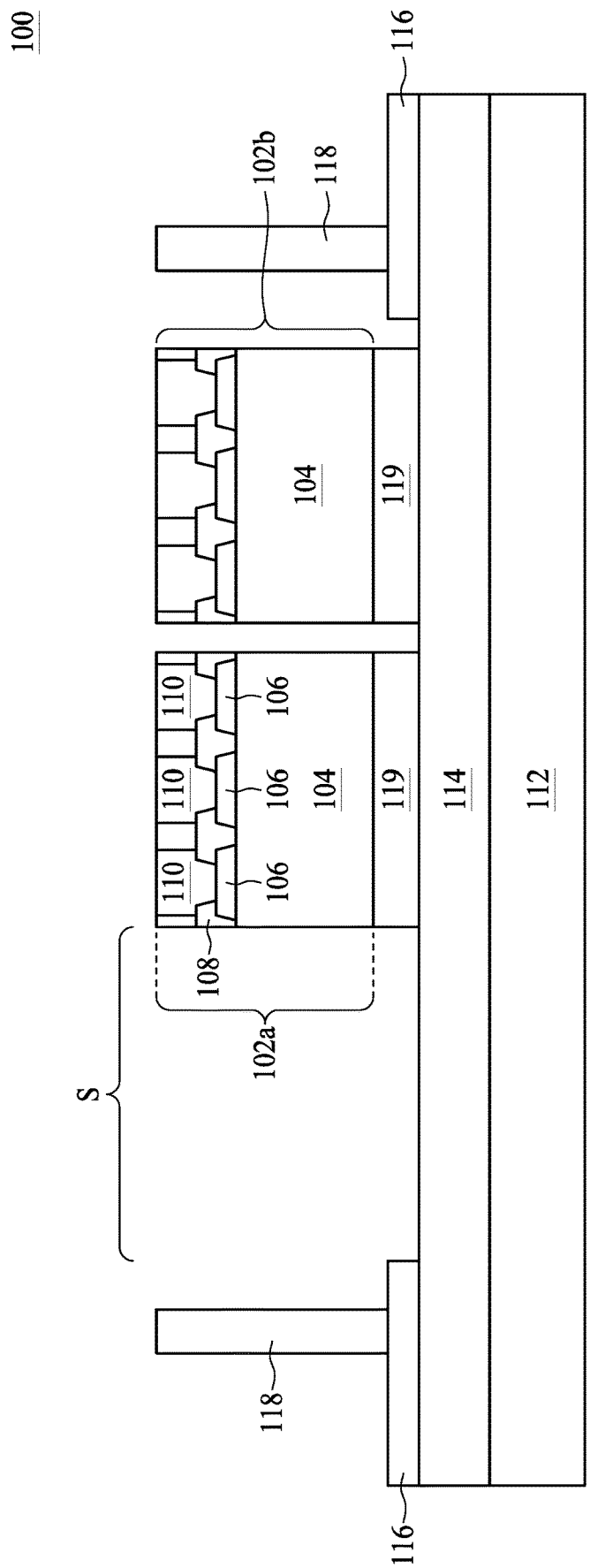

Referring to FIG. 1D, semiconductor dies 102, e.g., semiconductor dies 102a and 102b, are attached to the protection layer 114 among the conductive pillars 118. In some embodiments, semiconductor dies 102 are attached to the protection layer 114 through an adhesive layer 119. The adhesive layer 119 can be a die attach film (DAF), a dry film or a dicing tape. In some embodiments, a space S between one conductive pillar 118 and a neighboring semiconductor die 102a is specified. In other words, no semiconductor dies or conductive features are present within the space S. Such space S is reserved as paths of transmission or reception of electromagnetic wave.

Figure 1E:
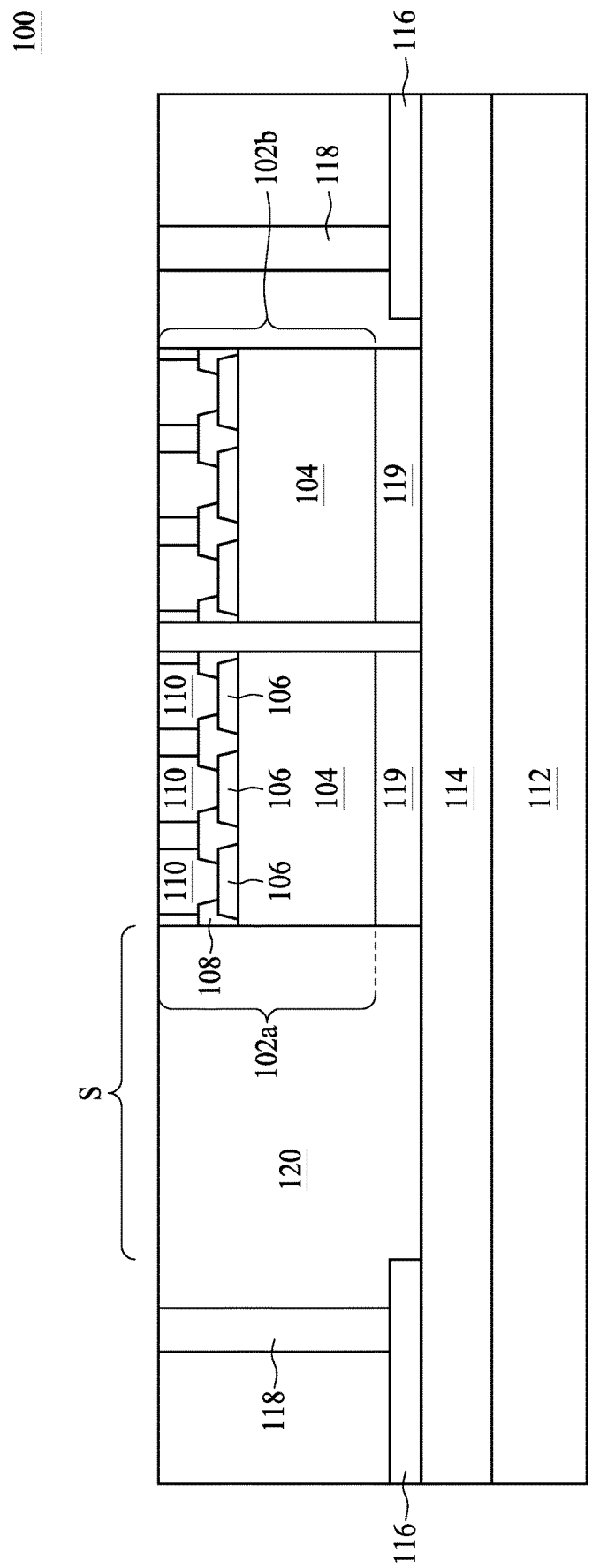

FIG. 1E shows the forming of an encapsulating material 120. The encapsulating material 120 encapsulates the protection layer 114, the semiconductor dies 102, the adhesive layer 119 and the conductive pillars 118. In addition, the encapsulating material 120 fills gaps between the semiconductor dies 102 and the conductive pillars 118. In some embodiments, the encapsulating material 120 fills the space S. The encapsulating material 120 may be a molding compound such as molding underfill, resin, PI, polyphenylene sulphide (PPS), polyether ether ketone (PEEK), polyethersulfone (PES), a heat resistant crystal resin, or combinations thereof. In some embodiments, the encapsulating material 120 may be formed with a variety of dielectric materials and may, for example, be ceramic, glass, silicon nitride, oxide (e.g., Ge oxide), oxynitride (e.g., GaP oxynitride), silicon dioxide ($SiO_2$), nitrogen-bearing oxide (e.g., nitrogen-bearing $SiO_2$), nitrogen-doped oxide (e.g., $N_2$-implanted $SiO_2$), silicon oxynitride ($Si_xO_yN_z$), or the like. In some embodiments, the encapsulating material 120 may be a polymeric material such as PBO, BCB, or any other suitable material.

The encapsulating material 120 may be formed by a variety of techniques, e.g., CVD, low-pressure CVD (LP-CVD), plasma-enhanced CVD (PECVD), high-density plasma CVD (HDPCVD), sputtering and physical vapor deposition, thermal growing, or the like. In some embodiments, a planarization operation, such as grinding or chemical mechanical polishing (CMP) methods, may be utilized to level the upper surface of the encapsulating material 120 with the semiconductor dies 102 and the conductive pillars 118. In the present embodiment, the conductive pillars 118 extend through the encapsulating material 120 and may be referred to as through-insulator-vias (TIV).

Figure 1F:
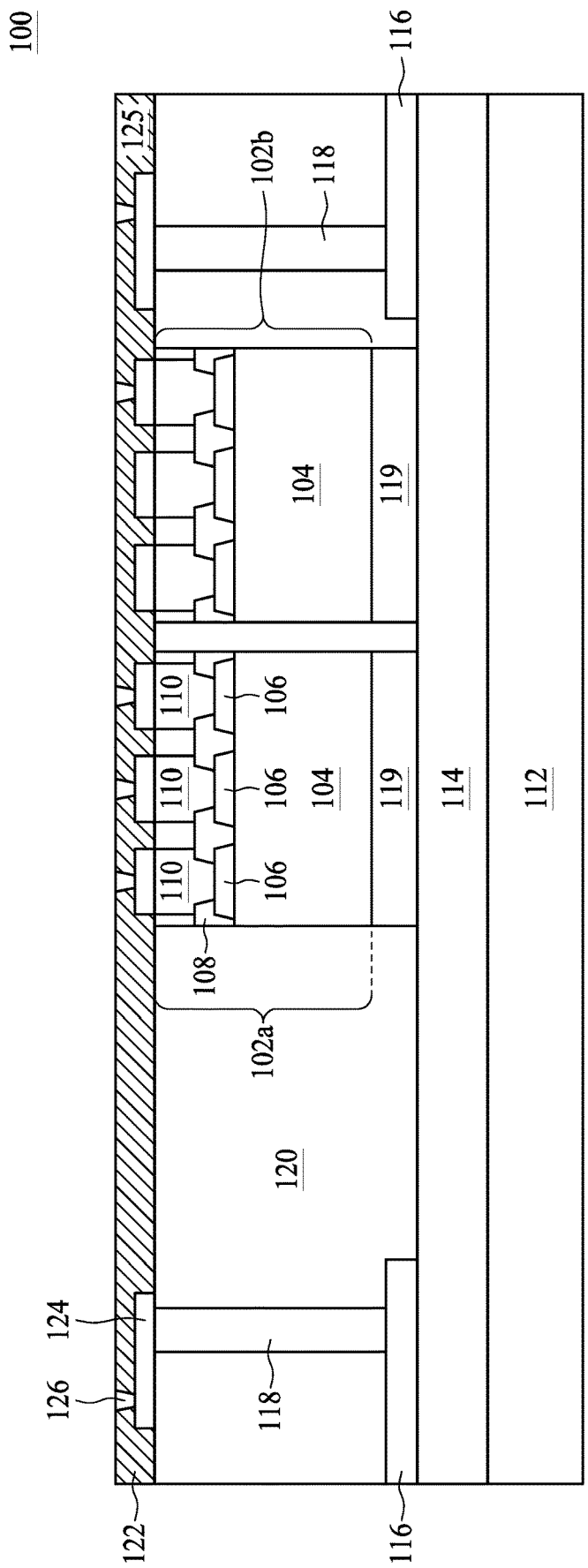

Referring to FIG. 1F, an RDL 122 is formed once the encapsulating material 120 is in place. The RDL 122 is configured to electrically couple the semiconductor dies 102 and conductive pillars 118 with other layers. The RDL 122 may include multiple metal layers, such as matal layer 124. Each of the metal layers may include conductive wires or lines and is electrically coupled to an adjacent overlaying or underlying metal layer through metal vias, such as metal via 126. In the present embodiment, a bottom metal layer (e.g., metal layer 124) includes several bond pads electrically coupled to the conductors 110 of the semiconductor dies 102. In some embodiments, the metal layer 124 and the metal via 126 are formed of conductive materials, such as copper, silver, aluminum, gold, tungsten, or combinations thereof. The metal layer 124 and metal via 126 of the RDL 122 are provided for illustration only. Other numbers of metal layers, metal vias, or conductive wires and alternative wiring patterns are also within the contemplated scope of the present disclosure.

Moreover, the aforesaid metal layers and metal vias are electrically insulated from other components. The insulation may be achieved by an insulating material 125. The insulating material 125, sometimes referred to as inter-metal dielectric (IMD), may be formed of oxides, such as un-doped silicate glass (USG), fluorinated silicate glass (FSG), borophosphosilicate glass (BPSG), tetraethosiloxane (TEOS), spin-on glass (SOG), high-density plasma (HDP) oxide, plasma-enhanced TEOS (PETEOS), low-k dielectric materials, or the like. The low-k dielectric materials may have k values lower than 3.8, although the dielectric materials may also be close to 3.8. In some embodiments, the k values of the low-k dielectric materials are lower than about 3.0, and may be lower than about 2.5. In accordance with some embodiments, the dielectric layer 125 comprises a polymer material. The formation method of the IMD 125 may include CVD, LPCVD, atmospheric-pressure CVD (APCVD), PECVD, sub-atmospheric CVD (SACVD), ALD, metal organic CVD (MOCVD), PVD, sputtering or other suitable deposition techniques.

Figure 1G:
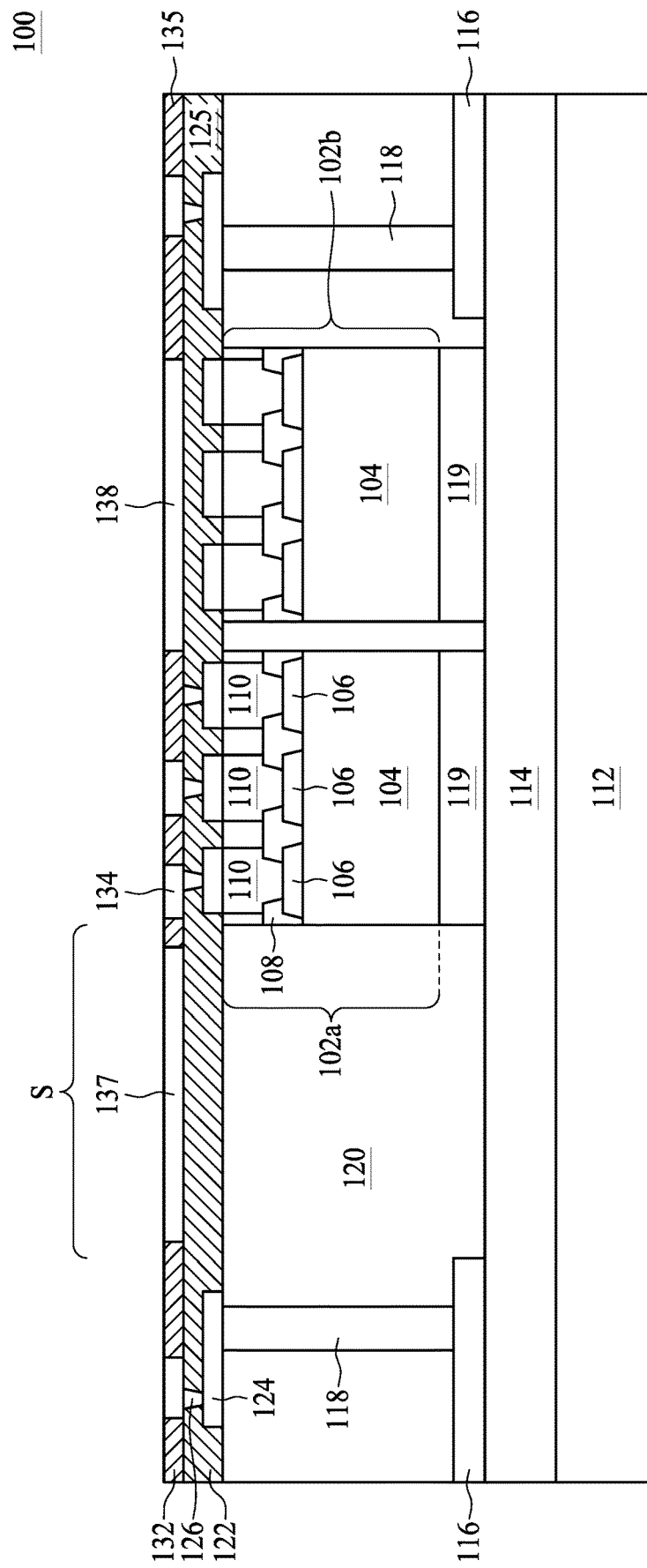

Referring to FIG. 1G, another RDL 132 is formed over the RDL 122. The RDL 132 may be configured to electrically couple the RDL 122 with overlaying layers. The RDL 122 may be arranged with different configurations, routing patterns and forming materials dependent upon application needs, and may include a metal layer 134 and an IMD 135. In some embodiments, the RDL 122 is configured similarly to the RDL 132. In some embodiments, the materials and manufacturing methods of the metal layer 124 and the IMD 135 may be similar to those applied to the RDL 122.

Still referring to FIG. 1G, conductive layers 137 and 138 are formed in the RDL 132. The conductive layer 137 or 138 is configured as an antenna plane or a ground plane of an antenna, and is electrically coupled to the semiconductor die 102a or 102b. In some embodiments, the conductive layers 137 and 138 have a shape like a plate, a sheet, or a strip. In the present embodiment, the conductive layer 137 is disposed directly above the space S. Stated differently, no conductive or semiconductive materials are present in space S that would, if present, overlap with the conductive layer 137; keeping space S free of such conductive or semiconductive materials serves to avoid reception, by the conductive or semiconductive material, of electromagnetic waves radiating from below the protection layer 114. The conductive layer 137 or 138 may be comprised of copper, silver, aluminum, gold, tungsten, or combinations thereof. In some embodiments, the conductive layer 137 or 138 may be formed in conjunction with the metal layer 134 during a single operation. Alternatively, the conductive layer 137 or 138 may be formed prior to or subsequent to the formation of the metal layer 134.

Figure 1H:
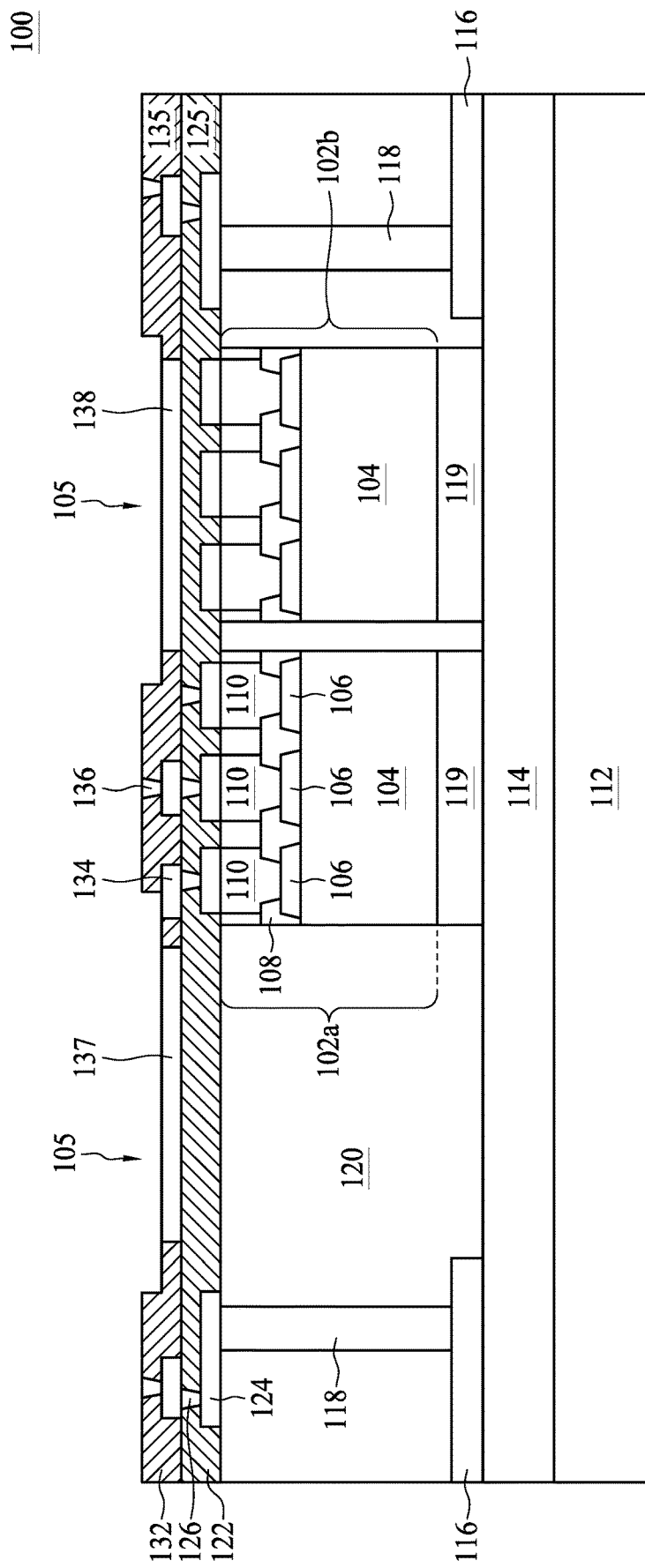

Referring to FIG. 1H, an additional layer of the IMD 135 is applied to the as-formed RDL 132. A layer of conductive vias 136 is then formed in the IMD 135 and electrically coupled to the underlying metal layer 134. Subsequently, the IMD 135 is recessed to expose the conductive layers 137 and 138 through the recesses 105. The recesses 105 may be obtained using an etching operation, such as a dry etching, a wet etching, or a reactive ionic etching (RIE) operation. In some embodiments, the recess 105 has a bottom area larger than the area of the conductive layer 137 or 138. In some embodiments, the recess 105 has a bottom width larger than the width of the conductive layer 137 or 138.

Figure 1I:
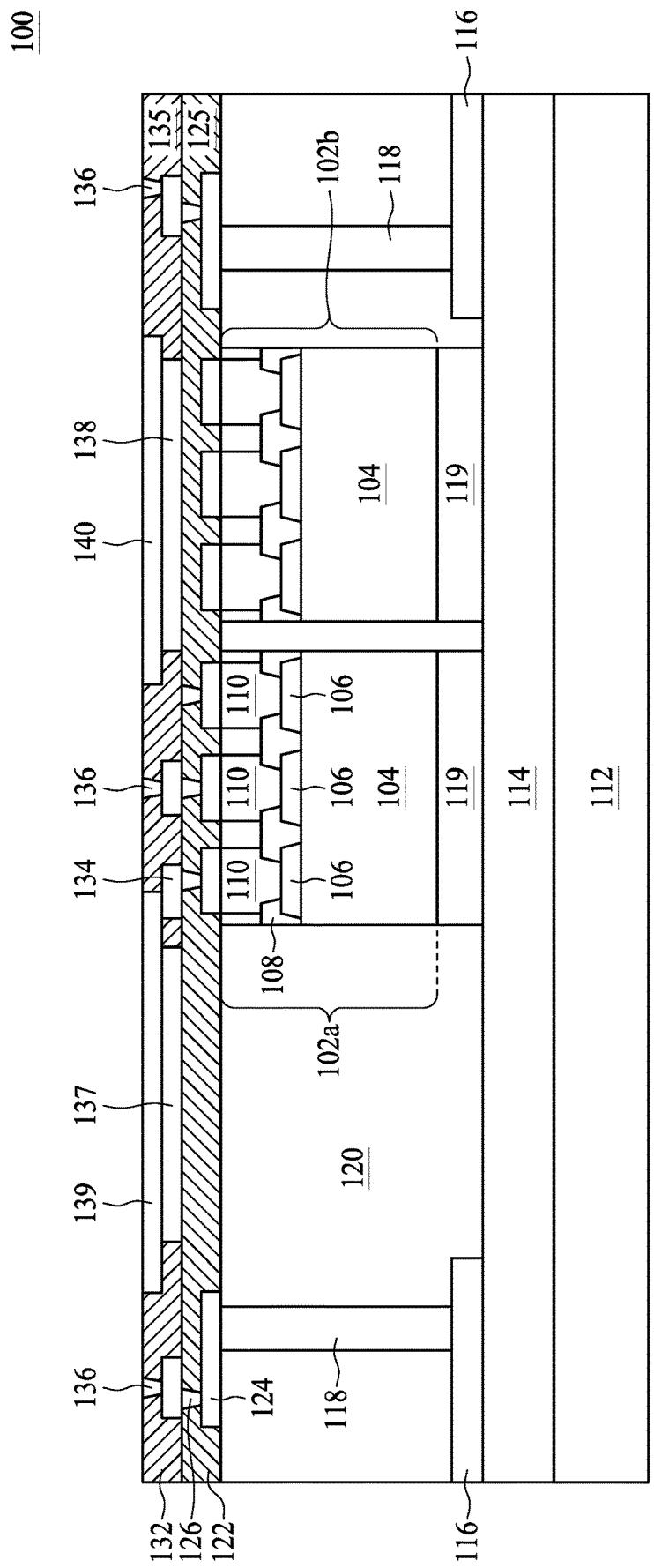

FIG. 1I shows formation of insulating films 139 and 140 in the recesses 105. The insulating film 139 or 140 serves as an insulating material between a pair of conductive plates of an antenna, as will be elaborated in following paragraphs. In some embodiments, the insulating films 139 and 140 are surrounded by the IMD 135. In some embodiments, the insulating film 139 or 140 is configured as a resonance cavity for a patch antenna. In order to achieve desired radiation performance, the insulating film 139 or 140 may be kept intact without any metal layer or metal via running therethrough. The thickness of the insulating film 139 or 140 measured in a direction substantially perpendicular to a surface of the RDL 132 is related to a main resonance frequency of the antenna in an end-fire direction. Generally, a greater dielectric constant of the insulating film 139 or 140 corresponds to less thickness required of the insulating film. In some embodiments, since the metal via 136 and the insulating film 139 or 140 are formed in a same layer, the metal via 136 and the insulating film 139 or 140 may have substantially equal thicknesses. In some embodiments, the thickness of the insulating film 139 or 140 is between about 0.1 μm and about 30 μm. In some embodiments, the thickness of the insulating film 139 or 140 is between about 0.1 μm and about 20 μm. In some embodiments, the thickness of the insulating film 139 or 140 is between about 0.5 μm and about 5 μm. In some embodiments, the thickness of the insulating film 139 or 140 is between about 2 μm and about 4 μm.

The formation of the insulating film may be formed using CVD, LPCVD, APCVD, PECVD, LCVD, MOCVD, SACVD, ALD, PVD, or other suitable deposition operations. The deposition operations may be performed at room temperature. In some embodiments, the deposition operations may be performed below about 250° C. In some embodiments, the deposition operations may be performed below about 200° C. The insulating film 139 or 140 may be comprised of dielectric materials with a high dielectric constant (high-k). The high-k dielectric material may be considered as having a dielectric constant greater than the dielectric constant of the IMD 125 or 135, or a dielectric constant of the encapsulating material 120. In an embodiment, the high-k dielectric material may be considered as having a dielectric constant greater than about 3.8. In some embodiments, the high-k dielectric material may be considered as having a dielectric constant greater than about 9.0. In some embodiments, the high-k dielectric material may be considered as having a dielectric constant greater than about 80. In some embodiments, the high-k dielectric material may be considered as having a dielectric constant greater than about 500. In some embodiments, a ratio of a dielectric constant between the insulating film 139 or 140 and a dielectric constant of the IMD 125 or 135 is greater than about 20. In some embodiments, a ratio of a dielectric constant between the insulating film 139 or 140 and a dielectric constant of the IMD 125 or 135 is greater than about 100.

The dielectric material of the insulating film 139 or 140 may be comprised of silicon oxide, silicon nitride, silicon oxynitride, metal oxides, metal nitrides, metal silicates, transition metal oxides, transition metal nitrides, transition metal silicates, oxynitrides of metals, metal aluminates, zirconium silicate, zirconium aluminate, or the like. In some embodiments, the insulating film 139 or 140 may be formed of $Al_2O_3$, $HfO_2$, $ZrO_2$, $HfO_xN_y$, $ZrO_xN_y$, $HfSi_xO_y$, $ZrSi_xO_y$, $HfSi_xO_yN_z$, $ZrSi_xO_yN_z$, $TiO_2$, $Ta_2O_5$, $La_2O_3$, $CeO_2$, $Bi_4Si_2O_{12}$, $WO_3$, $Y_2O_3$, $LaAlO_3$, $Ba_{1-x}Sr_xTiO_3$, $PbTiO_3$, $BaTiO_3$ (BTO), $SrTiO_3$ (STO), $BaSrTiO_3$ (BST), $PbZrO_3$, lead-strontium-titanate (PST), lead-zinc-niobate (PZN), lead-zirconate-titanate (PZT), lead-magnesium-niobium (PMN), yttria-stabilized zirconia (YSZ), ZnO/Ag/ZnO (ZAZ), a combination thereof, or the like.

In some embodiments, the insulating film 139 or 140 may include a layered structure. In some embodiments, the insulating film 139 or 140 may include at least two layers of different dielectric constants. In some embodiments, the insulating film may be formed of a first sublayer with a dielectric constant greater than 10.0 (e.g., $TiO_2$) and a second sublayer with a dielectric constant less than 4.0 (e.g., PBO). In some embodiments, a sublayer of the insulating film 139 or 140 may include a material that is a same material as that used in the IMD 125 or 135.

Existing patch antennas are usually disposed on a printed circuit board (PCB) with a large area for the antenna plane or the ground plane. As a result, the capacitance effect becomes more pronounced at high transmission frequencies, e.g., transmission frequencies in the range of tens of GHz. Such inevitable capacitance effect adversely impacts the antenna performance. Moreover, antenna designs adopt a dielectric material of a relatively low dielectric constant as the insulating layer between the pair of conductive plates. The dielectric constant may be as low as 3.8 or below. The resulting antenna performance can achieve a return loss of about −10 dB. In contrast, the proposed insulating film of a high-k dielectric material that is embedded in an RDL of a package device causes generation of a greater electric field between the pair of the conductive plates. Moreover, the high-k material leads to a reduced capacitance effect and an improved return loss of −30 dB or better. In addition, the impedance matching circuit can be tuned more easily to achieve better transmission performance.

Figure 1J:
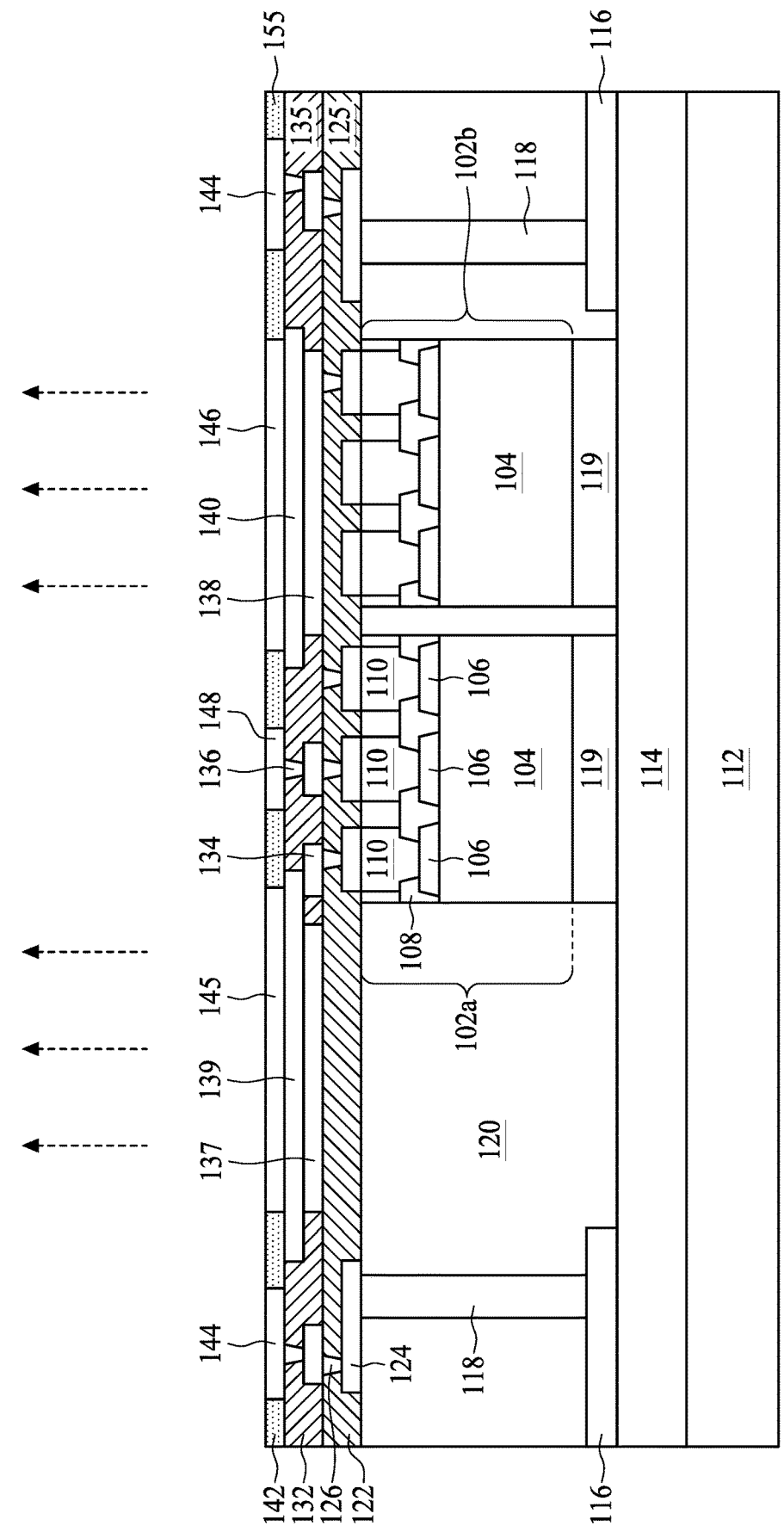

Referring to FIG. 1J, still another RDL 142 is formed over the RDL 132. The RDL 142 may be configured to electrically couple the RDL 132 with overlaying features. The RDLs 122, 132 and 142 may be collectively considered as sublayers of a composite RDL layer. The RDL 142 may be arranged with different configurations, routing patterns and forming materials dependent upon application needs, and may include a metal layer 148 and the IMD 155. In some embodiments, the RDL 122 is configured similarly to the RDL 122 or 132. In some embodiments, the metal layer 148 is formed of conductive materials, such as copper, silver, aluminum, gold, tungsten, or combinations thereof. The metal layer 148 and the IMD 155 may be formed by methods similarly to those applied to the RDL 132 or 122. In some embodiments, bond pads 144 are formed in the RDL 142 as interconnections electrically coupled to the metal vias 136 with overlaying components. The materials and manufacturing method of the bond pads 144 may be similar to those of the metal layer 148, and may be formed simultaneously with the metal layer 148 in some embodiments.

Still referring to FIG. 1J, conductive layers 145 and 146 are formed in the RDL 142. The conductive layer 145 or 146 is configured as an antenna plane or a ground plane, and is electrically coupled to the semiconductor die 102a or 102b. In some embodiments, the conductive layers 145 and 146 are formed like plates, sheets, or strips. The conductive layer 137 or 138 may be comprised of material such as copper, silver, aluminum, gold, tungsten, or combinations thereof. In some embodiments, the conductive layer 137 or 138 may be formed in conjunction with the metal layer 148 during a single operation. Alternatively, the conductive plate 137 or 138 may be formed prior to or subsequent to the formation of the metal layer 148.

The conductive layers 145 and 137 are configured as a pair of plates of an antenna structure, such as a micro-strip antenna or a patch antenna, with the insulating film 139 serving as the resonance cavity and insulator thereof. The conductive plates 145 and 137 may be configured as an antenna plane and a ground plane, respectively, or vice versa. As shown by the dotted arrows in FIG. 1J, when the upper conductive plate 145 is used as the antenna plane, the electromagnetic wave resonates within the resonance cavity, i.e., insulating film 139, and radiates upwardly from above the semiconductor package device 100 through the conductive plate 145. Similarly, another pair of conductive layers 146 and 138 forms a pair of plates of a second antenna structure with the insulating film 140 serving as the resonance cavity thereof. The conductive plate 146 serves as the antenna plane to radiate electromagnetic wave upwardly. In some embodiments, the conductive plates 145 and 146 are exposed from the RDL 142. In some embodiments, antenna planes from different pairs are integrated as a single antenna. For example, a two-branch antenna may be configured such that the conductive plates 145 and 137 serve as a first branch while the conductive plates 146 and 138 serve as a second branch. The two-branch antenna can be integrated to provide enhanced radiation performance.

Figure 1K:
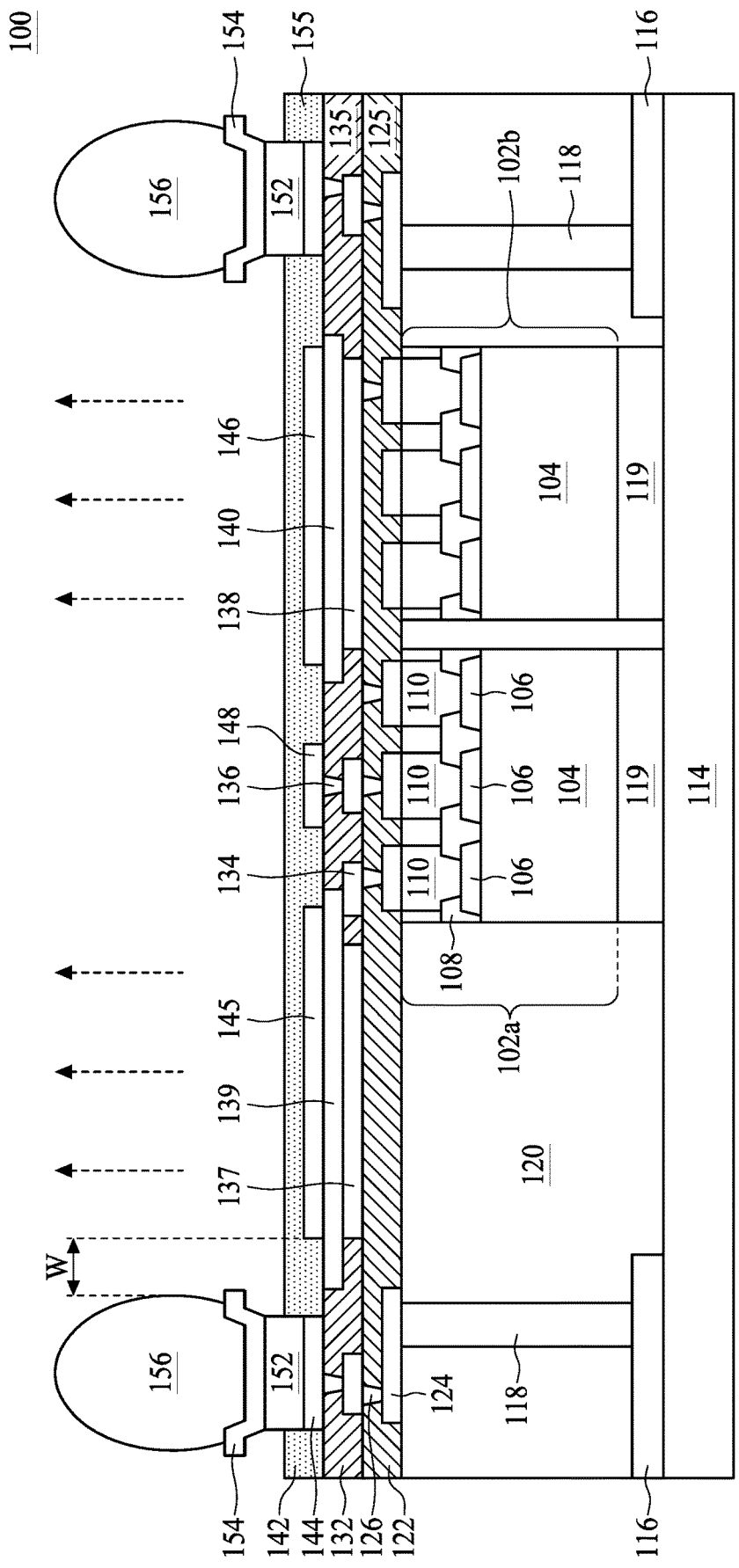

FIG. 1K illustrates a formation of external connectors 156. Initially, a metallic pillar 152 and an under bump metallization (UBM) 154 are sequentially formed over the bond pad 144. In some embodiments, the metallic pillar 152 may comprise a single layer or a multilayer structure. For example, the metallic pillar 152 comprises copper, cooper alloy, tin, nickel, nickel alloy, combinations, or the like. In an embodiment, the UBM 154 may comprise a diffusion barrier layer, a seed layer, or a seed layer over a diffusion barrier layer. In some embodiments, the diffusion barrier layer may include titanium, titanium nitride, tantalum, tantalum nitride, or the like. In some embodiments, the seed layer may comprise copper or copper alloys. The metallic pillar 152 and the UBM 154 may be formed by CVD, PVD, sputtering or other suitable methods.

Next, a solder material 156 is formed over the UBM 154. In some embodiments, the solder material 156 comprises lead-based materials, such as Sn, Pb, Ni, Au, Ag, Cu, Bi, combinations thereof, or mixtures of other electrically conductive material. In an embodiment, the solder material 156 is a lead-free material. A thermal process may be performed on the solder material 156, forming an external connector 156. In some embodiments, the external connector 156 comprises a spherical shape. However, other shapes of the external connector 156 may be also possible. In some embodiments, the external connector 156 may be contact bumps such as controlled collapse chip connection (C4) bumps, ball grid array bumps, or microbumps.

Referring to FIG. 1K, the IMD 155 may be thickened before the formation of the metallic pillar 152, the UBM 154 and the external connector 156. The thickened IMD 155 may extend over the conductive plates 145 and 146, that is different from the configuration of FIG. 1J. In some embodiments, the IMD 155 covers the top surface of the conductive plate 145 or 146. Since the IMD 155 is not comprised of conductive or semiconductive materials, it can protect the conductive plates 145 and 146 from external damage without degrading their radiation performance.

In some embodiments, the external connectors 156 in conjunction with the metallic pillars 152 and the UBMs 154 are disposed spaced apart laterally from the conductive plate 145 or 146. In other words, the transmission/receiving path of the conductive plate 145 or 146 is clear of conductive or semiconductive features of the semiconductor package device 100 in order to ensure a non-distorted radiation pattern. In some embodiments, a gap W between the conductive plate 145 and a periphery of the external connector 156 or UBM 154 is greater than 10 µm. In some embodiments, the gap W is greater than 50 µm. After the external connector 156 is formed, the semiconductor package device 100 is completed and the carrier 112 may be stripped.

In some embodiments, the ground plane 137 or 138 is electrically coupled to the semiconductor die 102a or 102b through a grounding pad. In some embodiments, a subset of the metal layer 124 in the RDL 122 in conjunction with a subset of the metal vias 126 are used to electrically coupled the ground plane 137 or 138 to the grounding pad. In some embodiments, the conductive pillar 118 is configured as a grounding path electrically coupled to a ground pad disposed in the RDL 116 or the protection layer 114. The ground plane 137 or 138 may be electrically grounded through the conductive pillar 118 rather than through the semiconductor die 102.

Figure 2:
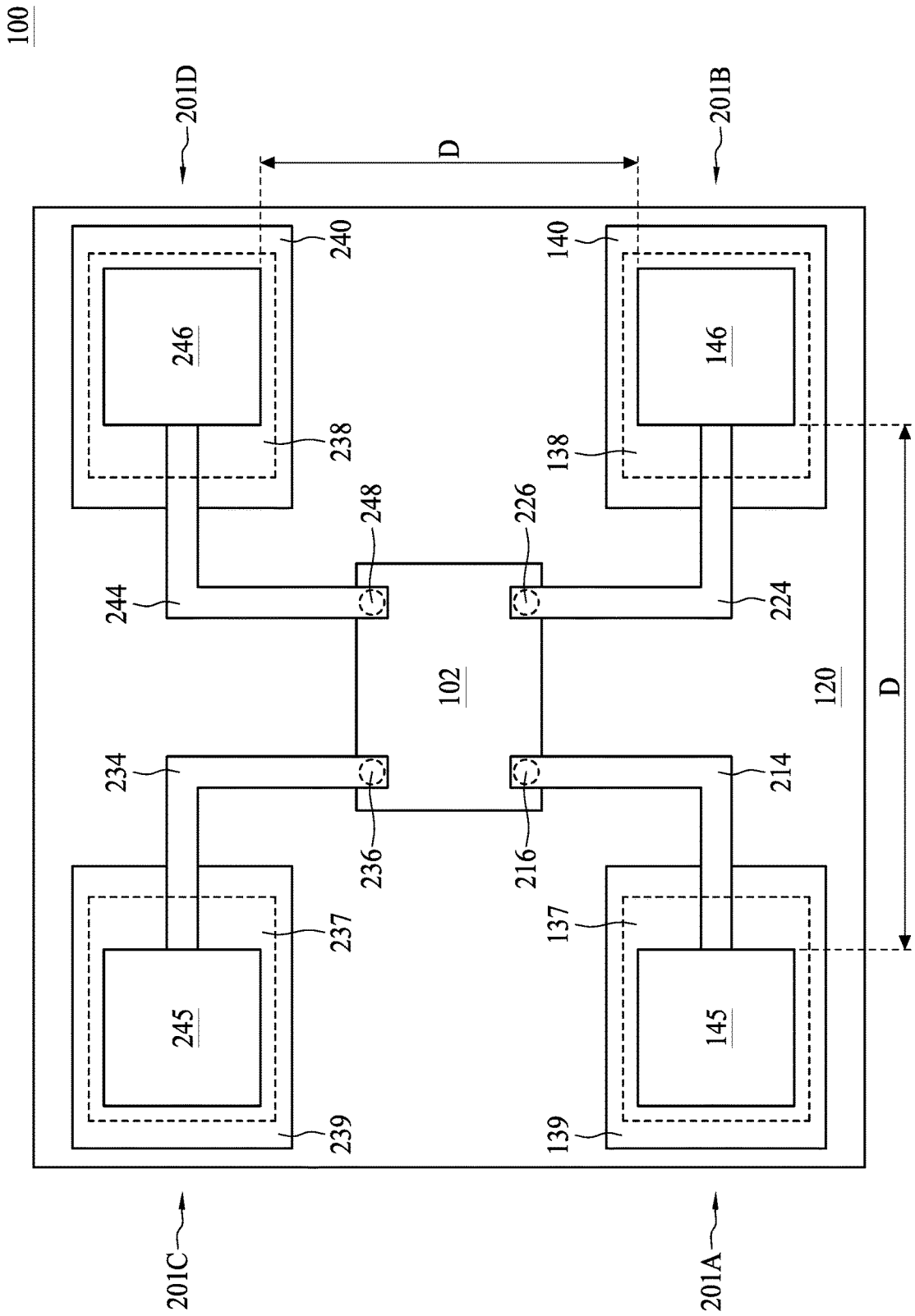
FIG. 2 is a schematic top view of a semiconductor package device, in accordance with some embodiments.

FIG. 2 is a schematic top view of the semiconductor package device 100 in FIG. 1K, in accordance with some embodiments. Some intermediate layers, such as IMDs 125, 135 and 155, are omitted from FIG. 2 for the sake of simplicity and clarity. In addition, only one semiconductor die 102 is shown for illustration. The semiconductor die 102 is electrically coupled to four branches 201A through 201D of a patch antenna. For example, the first branch 201A is comprised of a pair of conductive plates 145 and 137, the second branch 201B is comprised of a pair of conductive plates 146 and 138, the third branch 201C is comprised of a pair of conductive plates 245 and 237, and the fourth branch 201D is comprised of a pair of conductive plates 246 and 238. Additionally, metal vias 216, 226, 236 and 248 respectively couple the four branches of the antenna to the semiconductor die 102. Insulating films 139, 140, 239 and 240 are disposed between corresponding pairs of conductive plates. The shapes of the aforesaid conductive plates or insulating films have a rectangular shape in the present embodiment. However, other shapes are possible, e.g., a square shape, a circular shape, a polygonal shape or a strip shape. In some embodiments, in each of the antenna branches, the insulating film 139, 140, 239 or 240 may have a surface area greater than a surface area of the overlaying or underlying conductive plate thereof. As a result, the electric field generated by the conductive plates will be completely included within the insulating film to achieve the radiation performance as designed. In some embodiments, the insulating film 139, 140, 239 or 240 may have a width greater than a width of the overlaying or underlying conductive plate thereof. In some embodiments, the insulating film 139, 140, 239 or 240 may have geometry of 5 mm×5 mm. In some embodiments, the conductive plate of each antenna branch may have geometry of 950 µm×950 µm. In some embodiments, in each of the antenna branches, the ground plane (e.g., conductive plate 137 for branch 201A) may have a surface area greater than surface areas of the antenna plane (e.g., conductive plate 145) and the insulating film (e.g., film 139).

In some embodiments, the antenna branches 201A through 201D are arranged in an array, such as a square array. The semiconductor die 102 is placed at a center of the array. The dimensions and relative locations of the antenna branches of the antenna array are closely related to its performance. As far as millimeter wave applications, the distance between the adjacent branches of the antenna is usually small, and is suitable to be integrated with a semiconductor package device. For example, a radio frequency (RF) communication band of 60 GHz for some applications, such as car radar, is specified. Accordingly, the half wavelength of such RF wave will be about 2500 µm. As a result, the distance D between two adjacent branches, e.g., adjacent branches 201A and 201B or adjacent branches 201B and 201C, is determined as about 2500 µm. Such arrangement can help generation of constructive interference from various antenna branches, thus enhancing the radiation efficiency. In some embodiments, the overall width of a patch antenna measured from side to side, or the distance D between adjacent branches, is less than 3000 µm. In some embodiments, the distance D between adjacent branches is less than 2000 µm.

Still referring to FIG. 2, metal lines 214, 224, 234 and 224 respectively couple the metal vias 216, 226, 236 and 248 to one component plate (e.g., an antenna plane) of each of the four pairs of conductive plates. The metal lines 214, 224, 234 and 224 are configured as signal feed lines for delivery signal powers between the antenna planes and the semiconductor die 102. In some embodiments, the metal lines 214, 224, 234 and 224 may extend into different RDLs 122, 132 and 142 and may have meandering shapes. It can be observed that each metal line 214, 224, 234 or 224 extends mostly over the encapsulating material 120 viewed from above as shown in FIG. 2, except for the contact portion connecting to the respective pads on the semiconductor die 102. Additionally, the metal lines 214, 224, 234 and 224 are further surrounded by IMD 125, 135 or 155. Thus, horizontal portions of the metal line 214, 224, 234 or 224 run in a path encapsulated by dielectric materials (e.g., IMD or encapsulating material) rather than any conductive or semiconductive materials. Moreover, most vertical vias joining the aforesaid horizontal portions are also included in the IMD 125, 135 or 155. The signal loss attributed to the horizontal portions is reduced significantly.

Existing signal feed lines are usually disposed close to the substrate 104 of the semiconductor die 102. In some cases, the feed line is disposed in a layer between the conductors 110 and the connection terminals. The short gap between the feed line and the semiconductive material of the substrate 104 causes noticeable signal transmission loss through the substrate 104. In contrast, in the proposed framework, the feed lines 214, 224, 234 or 224 are disposed far above the substrate 104, with the intervening RDL 122, 132 or 142 therebetween, from a vertical viewpoint. Also, the feed lines 214, 224, 234 and 224 are distant from the substrate 104 laterally from a horizontal viewpoint. The resulting signal loss can be reduced accordingly.

Figure 3A:
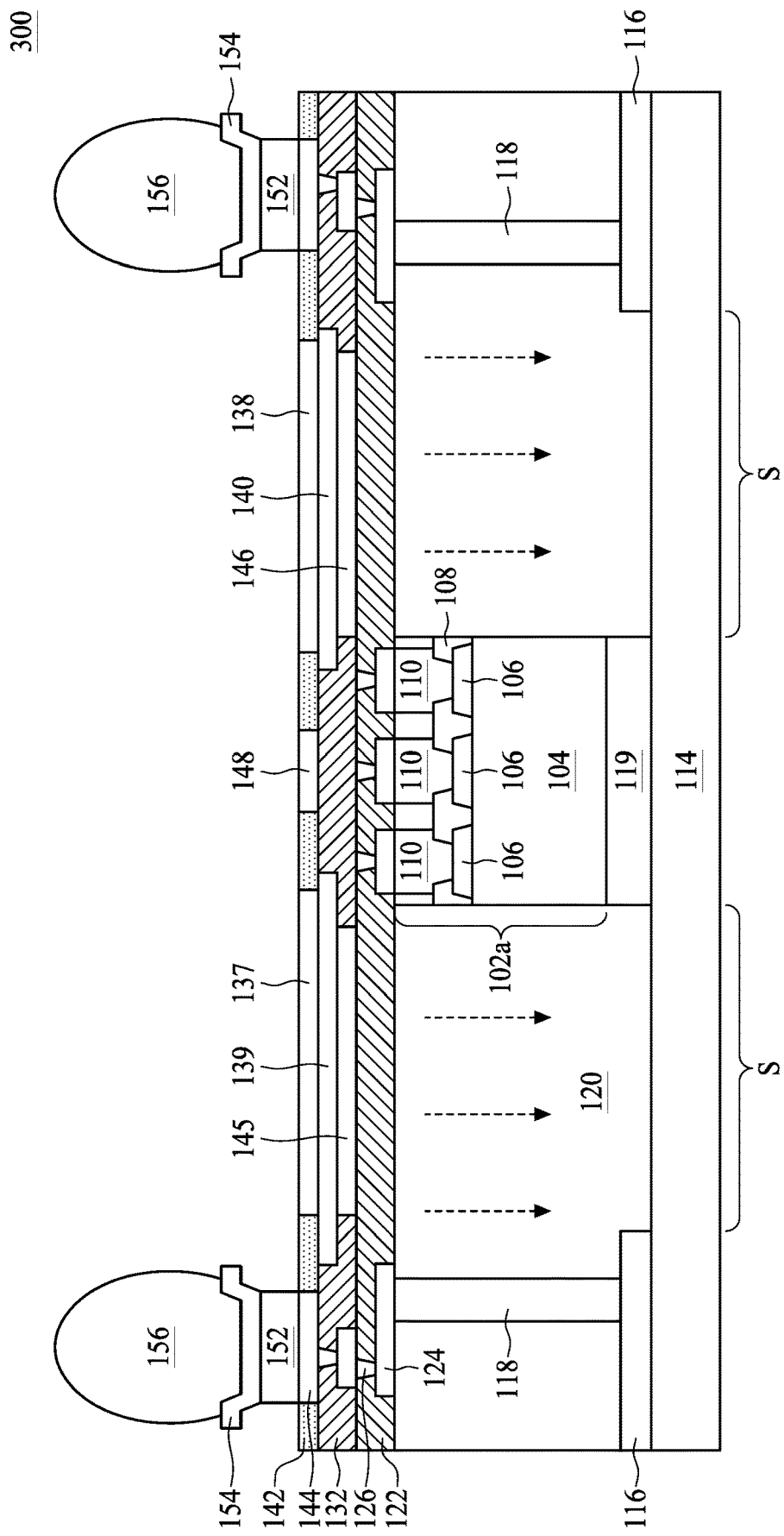
FIGS. 3A and 3B are schematic cross-sectional views of a semiconductor package device, in accordance with some embodiments.
Figure 3B:
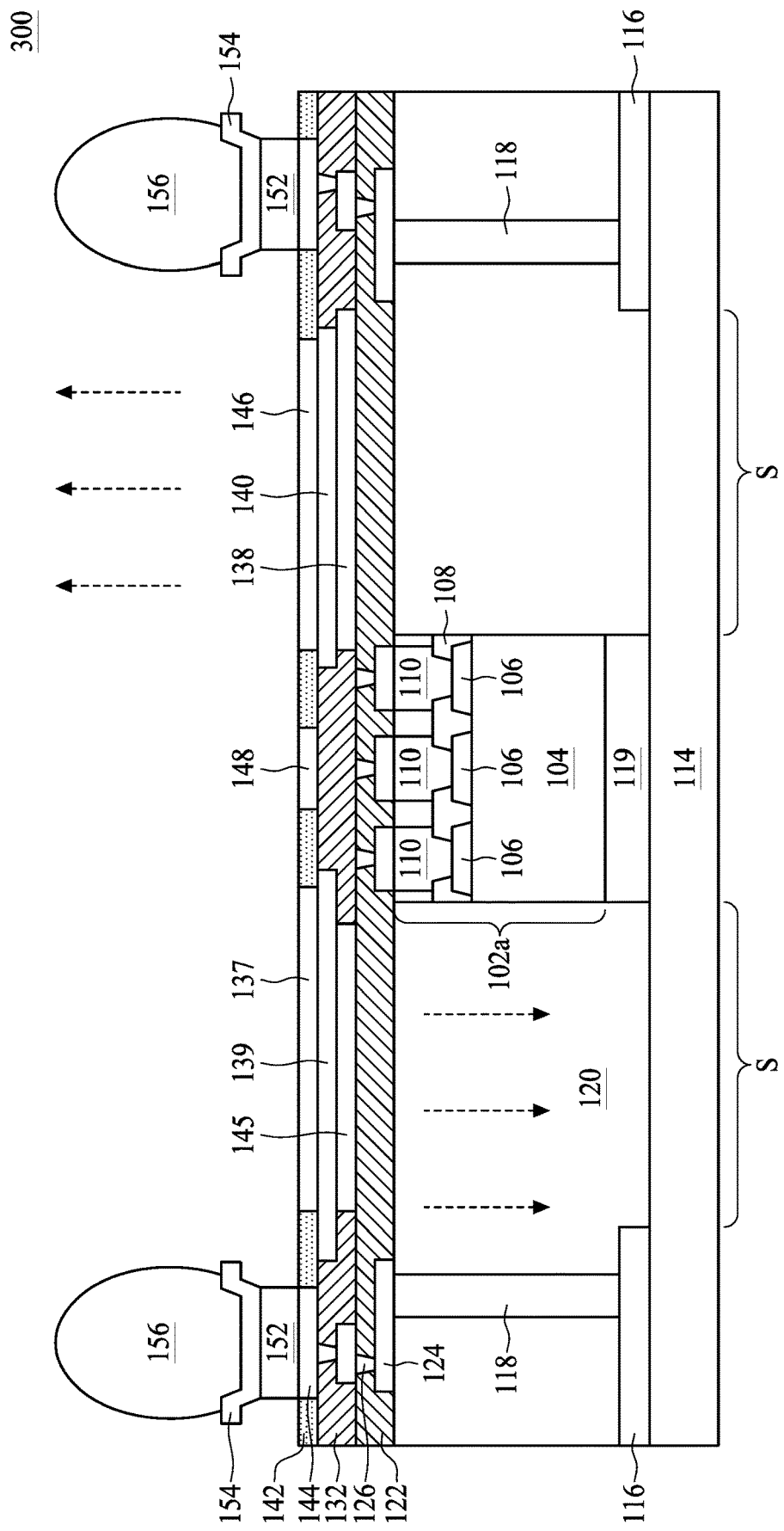

FIGS. 3A and 3B are schematic cross-sectional views of a semiconductor package device 300, in accordance with some embodiments. Referring to FIG. 1K and FIG. 3A, the semiconductor die 102b is removed from the semiconductor package device 300. In addition, the antenna plane 145 and the ground plane 137 are interchanged. Similarly, the antenna plane 146 and the ground plane 138 are interchanged. The dotted lines shown in FIG. 3A signify that the radiation faces towards the encapsulating material 120. By such disposition, the electromagnetic wave can be radiated to or received from below the semiconductor package device 100 through spaces S of the encapsulating material 120 and the RDL 122. As discussed previously, the spaces S of the encapsulating material 120 or RDL 122 do not contain any semiconductive or conductive features, thus allowing the electromagnetic wave to pass through with minimized distortion. In some embodiments, the antenna branches on the two sides have different configurations. Referring to FIG. 3B, the antenna planes 145 and 146 are configured to face toward and away from the encapsulating material 120, respectively. The configuration of FIG. 3B assists in expanding the coverage of antenna radiation and reception and can improve the system performance.

Figure 4:
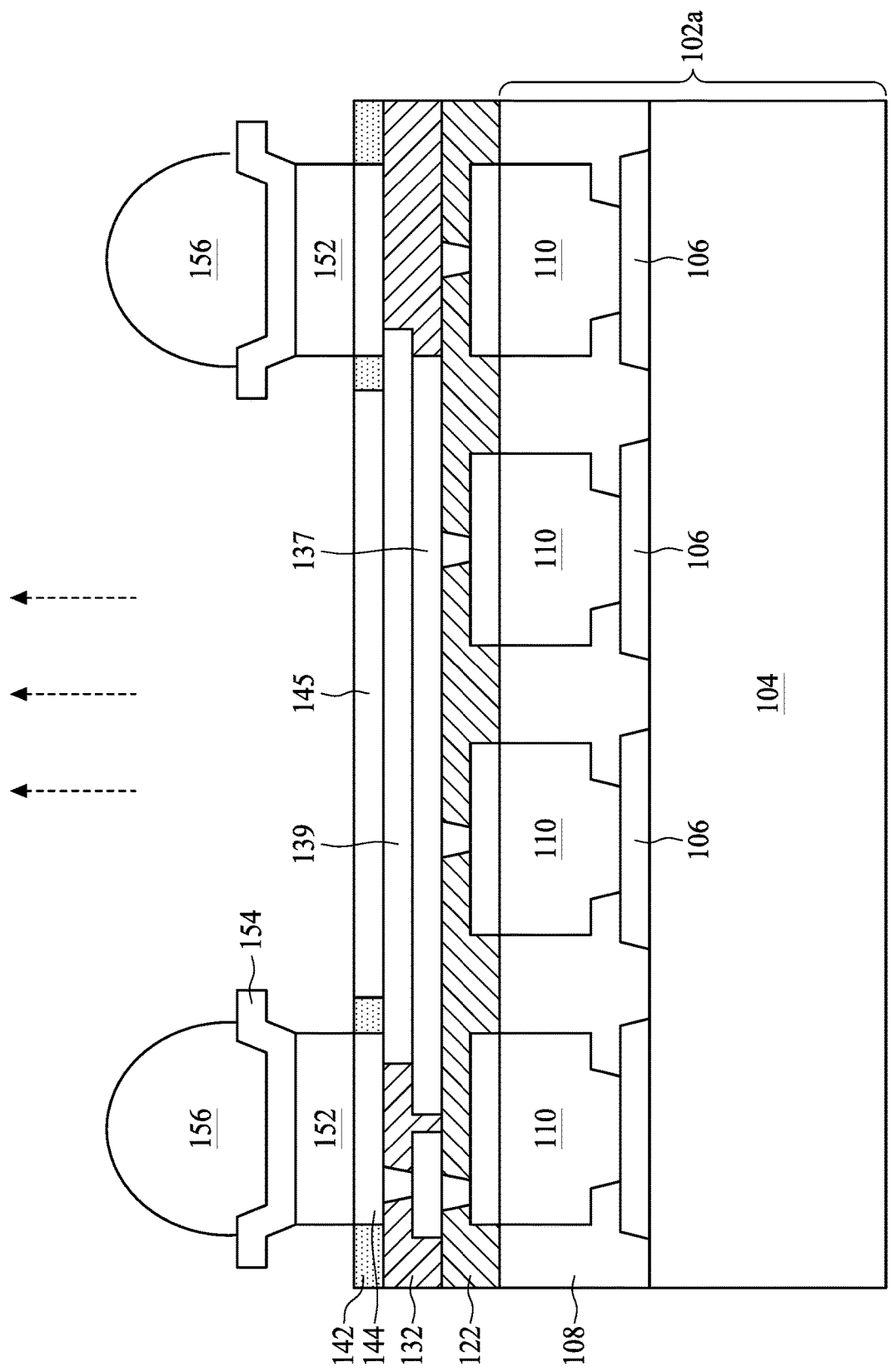
FIG. 4 is a schematic cross-sectional view of a semiconductor package device, in accordance with some embodiments.

FIG. 4 is a schematic cross-sectional view of a semiconductor package device 400, in accordance with some embodiments. In the present embodiment, the semiconductor package device 400 adopts a fan-in structure wherein the RDLs 122, 132 and 142 have sidewalls aligned with edges of the semiconductor die 102a. Referring to FIG. 1K and FIG. 4, the semiconductor package device 400 includes a single antenna branch composed of the conductive plates 145 and 137. The antenna plane 145 is disposed over the insulating film 139 and the ground plate 137. The antenna plane 145 is configured to radiate or receive electromagnetic wave through a space between the external connectors 156. The dotted lines signify that the antenna plane 145 faces away from the semiconductor die 102a.

Figure 5:
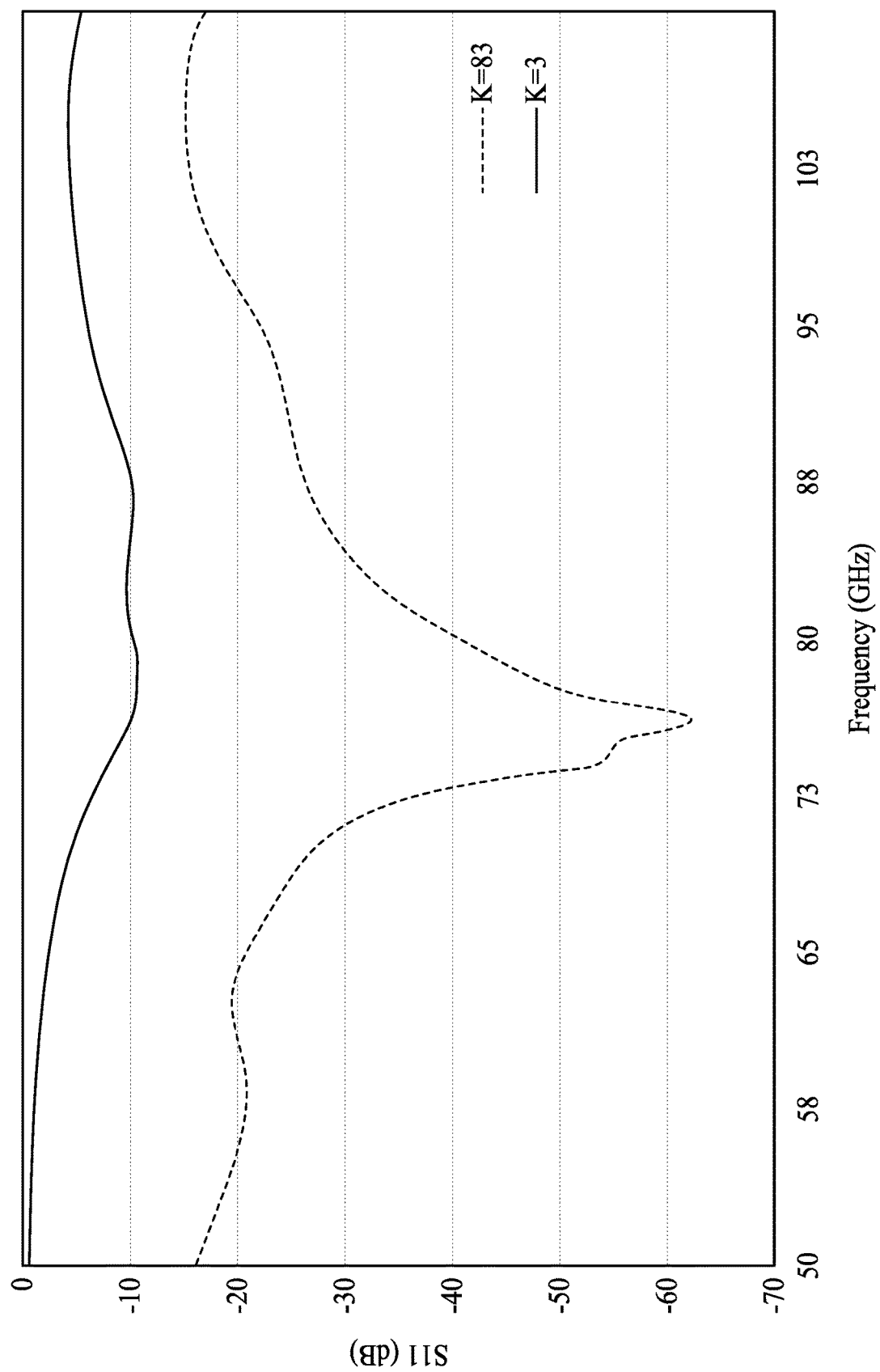
FIG. 5 is a schematic diagram of a simulation result for different insulating materials, in accordance with some embodiments.

FIG. 5 is a schematic diagram of a simulation result for different insulating materials, in accordance with some embodiments. The antenna configuration for the simulation is similar to the structure shown in FIG. 1K with the resonance frequency set at about 77 GHz. Two different insulating film materials are simulated and the performances of their S-parameters S11 (generic representation of a signal return loss) are compared. Referring to FIG. 5, the solid and dotted lines represent the simulation results for the dielectric materials with dielectric constants of around 3.0 and 83, respectively. As shown in the figure, the first material with a dielectric constant of 3.0 exhibits a return loss of between −10 dB and 0 dB with a local minimum at around 75-86 GHz. In contrast, the second dielectric material with a dielectric constant of 83 exhibits a signal loss of between −62 dB and −25 dB. Specifically, the second dielectric material provides a sharper frequency selectivity gain at a valley around 76 GHz. Thus, it is obvious that a high-k dielectric material of dielectric constant as high as 83 shows a prominent improvement over a low-k dielectric material of a dielectric constant as low as about 3.0. Both the average return loss value and the frequency selectivity gain around the specified frequency are enhanced.

An embodiment of the present disclosure provides a method of manufacturing a semiconductor device. The method includes: coupling a semiconductor die to a protection layer; forming a first redistribution layer over the semiconductor die, wherein the first redistribution layer includes a first conductive plate and a first dielectric material laterally surrounding the first conductive plate; forming a recess in the first redistribution layer, wherein the recess is over the first conductive plate and defined by the first dielectric material; depositing an insulating film in the recess with a second dielectric material of a dielectric constant greater than a dielectric constant of the first dielectric material; and forming a second redistribution layer including a second conductive plate over the insulating film. The insulating film electrically isolates the first conductive plate from the second conductive plate, and one of the first conductive plate and the second conductive plate is configured to radiate or receive electromagnetic wave.

An embodiment of the present disclosure provides a method of manufacturing a semiconductor package. The method includes: forming a redistribution layer over a semiconductor die, wherein the redistribution layer includes a first conductive plate, a second conductive plate disposed over the first conductive plate, an insulating film between the first conductive plate and the second conductive plate and electrically isolating the first conductive plate from the second conductive plate, and a first dielectric material different from the insulating film and laterally surrounding the first conductive plate, the second conductive plate and the insulating film. The second conductive plate forms a first pair of conductive plates with the first conductive plate. The method further includes forming a connector over the redistribution layer.

An embodiment of the present disclosure provides a method of manufacturing a semiconductor package. The method includes: coupling a semiconductor die to a first dielectric layer; forming a conductive pillar over the first dielectric layer adjacent to the semiconductor die; forming a first redistribution layer over the semiconductor die and the conductive pillar, wherein the first redistribution layer includes a first antenna plate and a second dielectric layer laterally surrounding the first antenna plate; forming an insulating film different from the second dielectric layer in the first redistribution layer; and forming a second redistribution layer over the first redistribution layer. The second redistribution layer includes a second antenna plate and a third dielectric layer laterally surrounding the second antenna plate, the first antenna plate and the second antenna plate overlap the insulating film and are laterally spaced apart from the semiconductor die from a top-view perspective.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   coupling a semiconductor die to a protection layer;
   forming a first redistribution layer over the semiconductor die, the first redistribution layer comprising a first conductive plate and a first dielectric material laterally surrounding the first conductive plate;

forming a recess in the first redistribution layer, the recess being over the first conductive plate and defined by the first dielectric material;

depositing an insulating film in the recess with a second dielectric material of a dielectric constant greater than a dielectric constant of the first dielectric material; and forming a second redistribution layer comprising a second conductive plate over the insulating film, the insulating film electrically isolating the first conductive plate from the second conductive plate, and one of the first conductive plate and the second conductive plate configured to radiate or receive electromagnetic wave.

2. The method according to claim 1, wherein forming a recess in the first redistribution layer comprises forming the recess to expose an upper surface of the first conductive plate.

3. The method according to claim 1, wherein the insulating film has an area larger than an area of at least one of the first conductive plate and the second conductive plate.

4. The method according to claim 1, wherein the insulating film comprises at least one of $Al_2O_3$, $HfO_2$, $ZrO_2$, $HfO_xN_y$, $ZrO_xN_y$, $HfSi_xO_y$, $ZrSi_xO_y$, $HfSi_xO_yN_z$, $ZrSi_xO_yN_z$, $TiO_2$, $Ta_2O_5$, $La_2O_3$, $CeO_2$, $Bi_4Si_2O_{12}$, $WO_3$, $Y_2O_3$, $LaAlO_3$, $Ba_{1-x}Sr_xTiO_3$, $PbTiO_3$, $BaTiO_3$, $SrTiO_3$, $BaSrTiO_3$, $PbZrO_3$, lead-strontium-titanate, lead-zinc-niobate, lead-zirconate-titanate, lead-magnesium-niobium, yttria-stabilized zirconia, and ZnO/Ag/ZnO.

5. The method according to claim 1, wherein the insulating film comprises a thickness between about 0.1 µm and about 20 µm.

6. The method according to claim 1, wherein the dielectric constant of the first dielectric material is less than about 3.8.

7. The method according to claim 1, further comprising forming a third redistribution layer over the protection layer and adjacent to the semiconductor die.

8. The method according to claim 7, further comprising forming a conductive pillar over the third redistribution layer and electrically coupling the first redistribution layer to the third redistribution layer.

9. The method according to claim 8, further comprising laterally surrounding the semiconductor die, the conductive pillar and the third redistribution layer with an encapsulating material.

10. The method according to claim 1, wherein forming a first redistribution layer over the semiconductor die further comprises forming a metal via in the first redistribution layer adjacent to the insulating film, the metal via having a thickness equal to a thickness of the insulating film.

11. A method of manufacturing a semiconductor package, the method comprising:

forming a redistribution layer over a semiconductor die, the redistribution layer comprising:

a first conductive plate; a second conductive plate disposed over the first conductive plate and forming a first pair of conductive plates with the first conductive plate;

a first insulating film between the first conductive plate and the second conductive plate and electrically isolating the first conductive plate from the second conductive plate; and a third conductive plate; a fourth conductive plate disposed over the third conductive plate and forming a second pair of conductive plates with the third conductive plate;

a second insulating film between the third conductive plate and the fourth conductive plat and electrically isolating the third conductive plate from the fourth conductive plate; and a first dielectric material different from the first and second insulating films and laterally surrounding the first conductive plate, the third conductive plate, the first insulating film and the second insulating film;

and forming a connector over the redistribution layer.

12. The method according to claim 11, wherein the first pair of conductive plates is laterally spaced apart from the connector.

13. The method according to claim 11, wherein the second pair of conductive plates is disposed on a side of the semiconductor die opposite the first pair of conductive plates.

14. The method according to claim 13, wherein the redistribution layer further comprises a third pair of conductive plates and a fourth pair of conductive plates, the third pair of conductive plates and the fourth pair of conductive plates being electrically coupled to the semiconductor die.

15. The method according to claim 14, wherein the first, the second, the third, and the fourth pairs of conductive plates are arranged in a square array viewed from above with the semiconductor disposed at a center of the square array.

16. The method according to claim 11, wherein the semiconductor die is spaced apart laterally from the first pair of conductive plates.

17. A method of manufacturing a semiconductor package, the method comprising:

forming a conductive pillar over a first dielectric layer;

disposing a semiconductor die over the first dielectric layer adjacent to the conductive pillar;

forming a first redistribution layer over the semiconductor die and the conductive pillar, the first redistribution layer comprising a first antenna plate and a second dielectric layer laterally surrounding the first antenna plate;

forming an insulating film different from the second dielectric layer in the first redistribution layer; and forming a second redistribution layer over the first redistribution layer, wherein the second redistribution layer comprises a second antenna plate and a third dielectric layer laterally surrounding the second antenna plate, the first antenna plate and the second antenna plate overlapping the insulating film and laterally spaced apart from the semiconductor die from a top-view perspective.

18. The method according to claim 17, further comprising forming an external connector disposed over the second redistribution layer and electrically coupled to the semiconductor die.

19. The method according to claim 17, further comprising laterally surrounding the semiconductor die and the conductive pillar with an encapsulating material.

20. The method according to claim 19, wherein the encapsulating material is free of conductive or semiconductive materials directly below the first antenna plate.

* * * * *